United States Patent
Kuksenkov

(10) Patent No.: US 7,822,096 B2
(45) Date of Patent: Oct. 26, 2010

(54) ALIGNMENT AND WAVELENGTH SELECTION IN EXTERNAL CAVITY LASERS

(75) Inventor: Dmitri Vladislavovich Kuksenkov, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 41 days.

(21) Appl. No.: 12/334,082

(22) Filed: Dec. 12, 2008

(65) Prior Publication Data

US 2010/0150184 A1 Jun. 17, 2010

(51) Int. Cl.
*H01S 3/08* (2006.01)

(52) U.S. Cl. .......................... 372/102; 372/20; 372/21; 372/22; 372/24; 372/29.01; 372/29.011; 372/29.014; 372/29.02; 372/93; 359/196.1; 359/201.2; 359/204.5; 359/211.5

(58) Field of Classification Search ............ 372/21, 372/22, 24, 29.01, 29.011, 29.014, 29.02, 372/93, 102, 20; 359/196.1, 201.2, 204.5, 359/211.5

See application file for complete search history.

(56) References Cited

U.S. PATENT DOCUMENTS

| 4,815,820 A | 3/1989 | McNeil et al. |
| 4,942,583 A | 7/1990 | Nazarathy et al. ............. 372/20 |
| 5,331,651 A | 7/1994 | Becker et al. ................. 372/32 |
| 5,347,527 A | 9/1994 | Favre et al. ................... 372/20 |
| 5,418,802 A | 5/1995 | Chwalek ...................... 372/20 |
| 5,448,398 A | 9/1995 | Asakura et al. ............. 359/328 |
| 5,493,575 A | 2/1996 | Kitamura ..................... 372/20 |
| 5,548,609 A | 8/1996 | Kitamura ..................... 372/92 |
| 5,579,327 A | 11/1996 | Ohtateme et al. ............. 372/20 |
| 5,644,584 A | 7/1997 | Nam et al. .................... 372/20 |

(Continued)

FOREIGN PATENT DOCUMENTS

JP 07-30180 1/1995

(Continued)

OTHER PUBLICATIONS

Zorabedian et al., "Alignment-Stabilized Grating-Runed External-Cavity Semiconductor Laser", Optics Letters, Optical Society of America, vol. 15, No. 19, 1990, pp. 483-485.

(Continued)

*Primary Examiner*—Minsun Harvey
*Assistant Examiner*—Yuanda Zhang
(74) *Attorney, Agent, or Firm*—Kwadjo Adusei-Poku

(57) ABSTRACT

A method of operating a laser projection system is provided. The projection system comprises an external cavity laser, an optical intensity monitor, laser projection optics, and a controller. The external cavity laser comprises a laser diode, an intra-cavity wavelength conversion device, and a wavelength selective element. According to the method, the position of the wavelength selective element is adjusted relative to an optical axis Z of the external cavity laser to optimize output intensity. Specifically, the position of the wavelength selective element is adjusted by (i) tilting the wavelength selective element about its wavelength selective axis Y to reflect a wavelength of interest along an optimum path in an XZ plane of the external laser cavity and (ii) tipping the wavelength selective element about its wavelength insensitive axis X to reflect the wavelength of interest along an optimum path in a YZ plane of the external laser cavity. Additional embodiments are disclosed and claimed.

19 Claims, 2 Drawing Sheets

U.S. PATENT DOCUMENTS

| | | | |
|---|---|---|---|
| 6,370,168 B1 | 4/2002 | Spinelli | 372/22 |
| 6,393,038 B1 | 5/2002 | Raymond et al. | 372/22 |
| 6,438,153 B1 | 8/2002 | Caprara et al. | 372/92 |
| 6,597,710 B2 | 7/2003 | Vilhelmsson et al. | 372/20 |
| 6,690,690 B2* | 2/2004 | Marron | 372/20 |
| 7,173,950 B2 | 2/2007 | Hand et al. | 372/22 |
| 7,177,340 B2 | 2/2007 | Lang et al. | 372/102 |
| 7,756,170 B2* | 7/2010 | Almoric et al. | 372/22 |
| 2005/0265419 A1 | 12/2005 | Fujii et al. | |
| 2005/0286573 A1 | 12/2005 | Hand et al. | |
| 2006/0023757 A1* | 2/2006 | Mooradian et al. | 372/18 |
| 2007/0153862 A1 | 7/2007 | Shchegrov et al. | |
| 2007/0153866 A1* | 7/2007 | Shchegrov et al. | 372/50.124 |
| 2009/0022188 A1* | 1/2009 | Almoric et al. | 372/22 |

FOREIGN PATENT DOCUMENTS

| | | |
|---|---|---|
| JP | 09-186387 | 7/1997 |
| JP | 2008-218969 | 9/2008 |

OTHER PUBLICATIONS

Kuksenkov et al.; "Green Laser Source Based on Frequency Doubling of Semiconductor Laser in Folded External Cavity", Leos Annual Meeting Conference Proceedings, 2009, pp. 602-603.

* cited by examiner

ALIGNMENT AND WAVELENGTH SELECTION IN EXTERNAL CAVITY LASERS

BACKGROUND OF THE INVENTION

The present invention relates generally to semiconductor lasers and, more particularly, to schemes for providing optical alignment and wavelength selection in external cavity semiconductor lasers.

SUMMARY OF THE INVENTION

The present invention relates generally to frequency-converted external cavity semiconductor lasers, which may be configured in a variety of ways. For example and by way of illustration, not limitation, in one type of external cavity configuration, a wavelength converting device, such as a second or third harmonic generation (SHG) crystal, is placed inside the cavity of an external cavity configuration to achieve intra-cavity wavelength conversion. As may be gleaned from teachings in the art, wavelength conversion devices are configured to generate higher harmonic waves of a fundamental laser signal. For example, a 1060 nm laser can be tuned to the center of the spectral acceptance curve of a SHG crystal, which converts the wavelength to 530 nm. However, the wavelength conversion efficiency of the SHG crystal, such as MgO-doped periodically poled lithium niobate (PPLN), is strongly dependent on the wavelength matching between the laser diode output wavelength and the SHG device phase-matched pump wavelength.

Tunable external cavity lasers can be configured to include a PPLN crystal or some other type of wavelength conversion device in the laser cavity and use a narrow band spectral filter, wavelength selective mirror, or some other type of wavelength selective element in the external resonator of the laser to tune the lasing wavelength. One type of external cavity configuration, commonly referred to as a Littrow configuration, for example, comprises a laser diode, a collimating lens, and a diffraction grating. A first order diffracted beam provides optical feedback to the laser diode and the lasing wavelength can be tuned by rotating the wavelength selective element.

For many applications, one of which is video projection, it is important that the laser source be environmentally stable, maintaining minimal variations in output power over a wide range of ambient temperatures and operating conditions. The phase matched wavelength of many types of wavelength conversion devices used in external cavity lasers changes with temperature. To accommodate for this change, the output wavelength of the semiconductor laser can be adjusted by rotating the wavelength selective element to change the incidence/reflection angle of the element relative to the optical axis of the cavity. The alignment of the various optical components in the external cavity laser can also change with temperature or over time, particularly under unfavorable operating conditions. As such, to minimize power variations, the relative position of the laser diode chip, the wavelength conversion device, and the other optical elements of the external cavity laser often needs to be maintained with micrometer or sub-micrometer precision.

The methods and configurations disclosed herein help minimize these sources of power variation. According to one embodiment disclosed herein, a method of operating a laser projection system is provided. The projection system comprises an external cavity laser, an optical intensity monitor, a laser projection optics, and a controller. The external cavity laser comprises a laser diode, an intra-cavity wavelength conversion device, and a wavelength selective element. According to the method, the position of the wavelength selective element is adjusted relative to an optical axis Z of the external cavity laser to optimize output intensity. Specifically, the position of the wavelength selective element is adjusted by (i) tilting the wavelength selective element about its wavelength selective axis Y to reflect a wavelength of interest along an optimum path in an XZ plane of the external laser cavity and (ii) tipping the wavelength selective element about its wavelength insensitive axis X to reflect the wavelength of interest along an optimum path in a YZ plane of the external laser cavity.

According to another embodiment disclosed herein, a system for generating a projected laser image is provided, wherein the system is programmed to adjust the position of the wavelength selective element relative to an optical axis Z of the external cavity laser to optimize the output intensity by tilting the wavelength selective element about its wavelength selective axis Y to reflect a wavelength of interest along an optimum path in an XZ plane of the external laser cavity and tipping the wavelength selective element about its wavelength insensitive axis X to reflect the wavelength of interest along an optimum path in a YZ plane of the external laser cavity. The wavelength selective element is configured such that a given degree of tipping about the wavelength insensitive axis X yields an insignificant degree of wavelength tuning relative to that which would be generated under a corresponding degree of tilting about the wavelength selective axis Y.

According to yet another embodiment disclosed herein, an external cavity laser is provided comprising a laser diode, an intra-cavity wavelength conversion device, a wavelength selective element, and a multi-axial actuator. The wavelength selective element is coupled to the multi-axial actuator to enable adjustment of the position of the wavelength selective element relative to an optical axis Z of the external cavity laser by tilting and tipping the wavelength selective element about a wavelength insensitive axis X and a wavelength selective axis Y. The tilting of the wavelength selective element about its wavelength selective axis Y reflects a wavelength of interest along an optimum path in an XZ plane of the external laser cavity. The tipping of the wavelength selective element about its wavelength insensitive axis X reflects the wavelength of interest along an optimum path in a YZ plane of the external laser cavity. The wavelength selective element is configured such that a given degree of tipping about the wavelength insensitive axis X yields an insignificant degree of wavelength tuning relative to that which would be generated under a corresponding degree of tilting about the wavelength selective axis Y.

BRIEF DESCRIPTION OF THE DRAWINGS

The following detailed description of specific embodiments of the present invention can be best understood when read in conjunction with the following drawings, where like structure is indicated with like reference numerals and in which.

DETAILED DESCRIPTION

Figure 1:
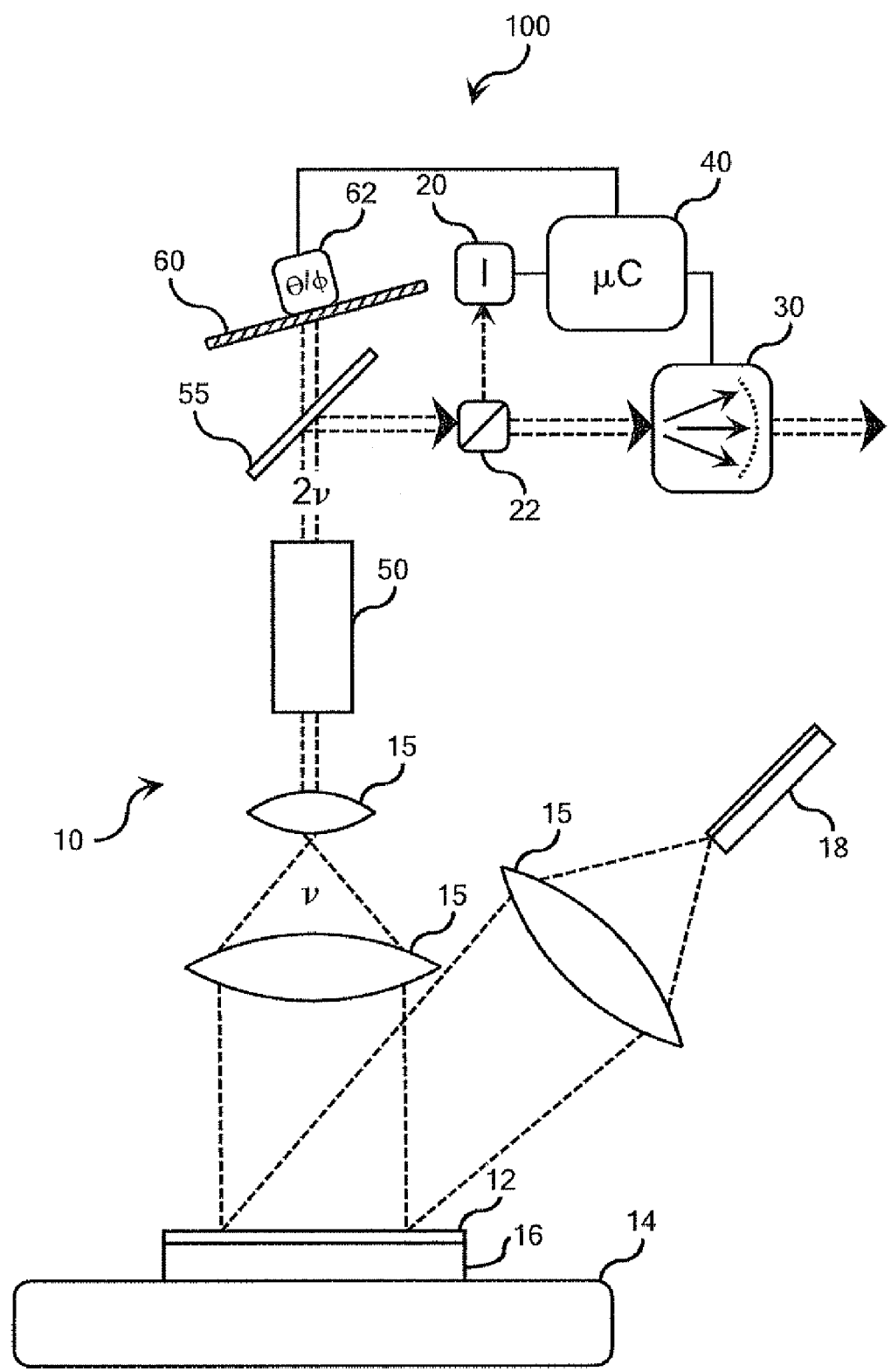
FIG. 1 is a schematic illustration of a laser projection system according to one embodiment disclosed herein.
Figure 2:
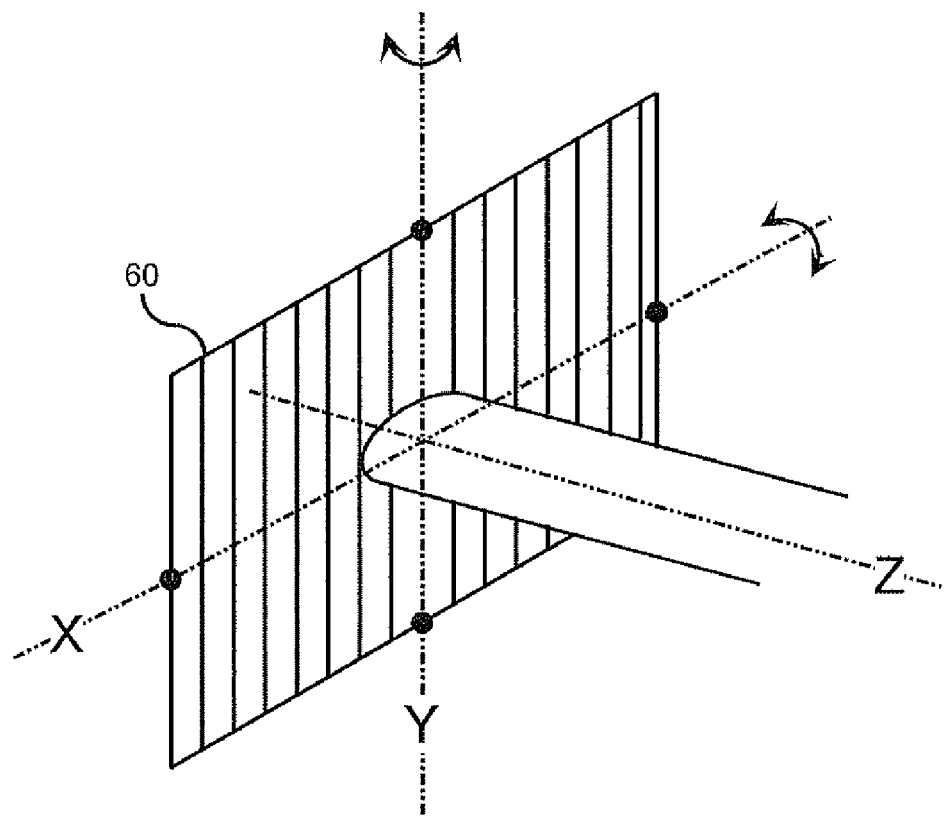
FIG. 2 is a schematic illustration of the manner in which the position of a wavelength selective element can be adjusted.

Referring to FIGS. 1 and 2, the concepts of the present invention may be conveniently illustrated with general reference to a laser projection system 100 comprising an external cavity laser 10, an optical intensity monitor 20, laser projection optics 30, and a controller 40. In FIG. 1, the external cavity laser 10 comprises an optically pumped laser diode including, for example, an active lasing medium 12, heat sink 14, a highly reflective dielectric or semiconductor mirror 16, a pump laser 18, and associated optical elements 15 configured to direct pump radiation to the active lasing medium 12 and to redirect emissions from the active lasing medium to the wavelength conversion device.

The external cavity laser 10 also comprises an intra-cavity wavelength conversion device 50, a dichroic mirror 55, and a wavelength selective element 60, which defines a wavelength selective axis Y and a wavelength insensitive axis X. In the external cavity laser 10, the wavelength selective element 60 is configured such that a given degree of tipping about the wavelength insensitive axis X yields an insignificant degree of wavelength tuning relative to that which would be generated under a corresponding degree of tilting about the wavelength selective axis Y. For example, and not by way of limitation, the wavelength selective element 60 can be constructed as a ruled or holographic diffraction grating, a prism with a highly reflective coating on one of its sides, or a combination of a prism and a grating.

In operation, the output intensity of the external cavity laser 10 is monitored with the aid of a partially reflective beam splitter 22, which directs a portion of the light generated by the laser 10 to the optical intensity monitor 20. The optical intensity monitor 20 is configured to generate an electrical or optical signal representing variations in the intensity of the light generated by the laser source. The controller 40, which is in communication with the optical intensity monitor 20, receives or samples the signal from the optical intensity monitor 20 and can be programmed to control the wavelength selective element as a function of the sampled intensity. It is contemplated that a variety of alternative configurations may be utilized to monitor the intensity of the output beam without departing from the scope of the present invention.

The position of the wavelength selective element 60 is adjusted such that the wavelength selective element 60 serves both as a wavelength tuning element maintaining the operating wavelength in the center of the conversion bandwidth of the wavelength conversion device 50 (dependent on the optical phase matching between pump and wavelength converted light) and as an adaptive mirror to maintain optimal coupling of light within the various optical components of the external cavity laser 10. To do so, the wavelength selective element is (i) tilted about the wavelength selective axis Y and/or (ii) tipped about the wavelength insensitive axis X such that the wavelength of interest matching an optimum phase matching wavelength of the intra-cavity wavelength conversion device 50 is reflected precisely back along the beam axis through an intra-cavity wavelength conversion device 50.

Specifically, referring to the optical axes illustrated in FIG. 2, the position of the wavelength selective element 60 can be adjusted to optimize output intensity by (i) tilting the wavelength selective element 60 about the wavelength selective axis Y to reflect a phase matched wavelength along an optimum path in the XZ plane of the external laser cavity 10 and (ii) tipping the wavelength selective element 60 about the wavelength insensitive axis X to reflect the wavelength of interest along an optimum path in a YZ plane of the external laser cavity. As will be described in further detail below, the wavelength selective element 60 can be rotated such that the path of the reflected wavelength of interest is directed back through the intra-cavity wavelength conversion device 50 with sub-micron precision. In operation, the projector 10 may alternate between tilting and tipping of the wavelength selective element 60 in an iterative process until the wavelength of interest is reflected along the optimum path in the XZ and YZ planes. Alternatively, the projector can execute the tilting and tipping operations simultaneously or in succession until the wavelength of interest is reflected along the optimum path in the XZ and YZ planes.

The aforementioned tilting and tipping can be executed while monitoring a wavelength-converted output intensity of the external cavity laser 10 or while monitoring the native wavelength output intensity of the external cavity laser 10. In addition, in either case, the tilting and tipping of the wavelength selective element 60 can be executed while operating the laser projection optics 30 to generate a scanned laser image and may be advantageously affected by mounting the wavelength selective element 60 to a multi-axial actuator, for example, a two-axis gimbal mechanism. The laser projection optics 30 may comprise a variety of optical elements including, but not limited to, a two-axis, gimbal mounted, MEMS scanning mirror.

Figure 3:
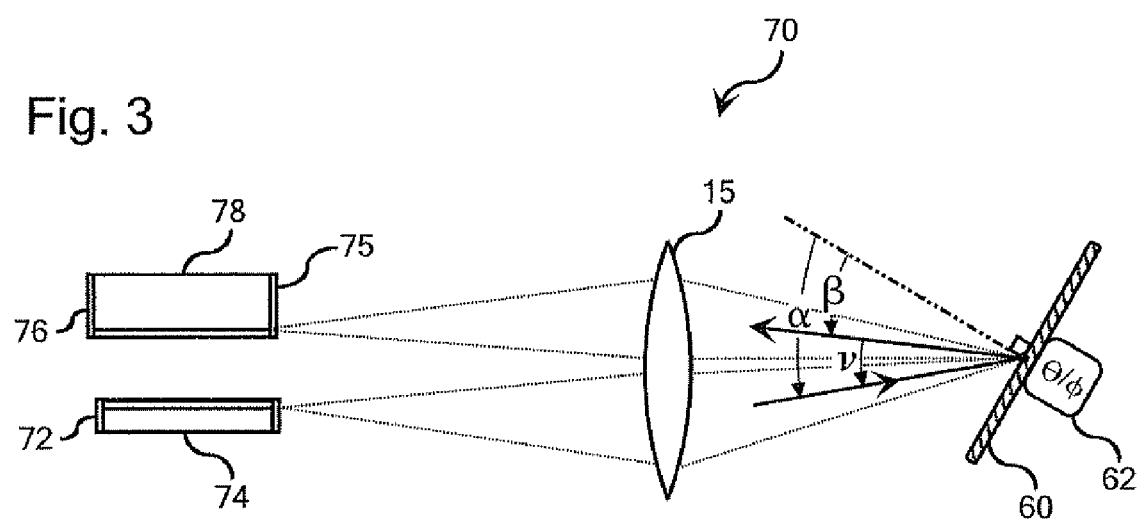
FIG. 3 is a schematic illustration of a laser according to another embodiment disclosed herein.

Although FIG. 1 illustrates a laser projection system 100 including an external cavity laser 10 in the form of an optically pumped, external cavity Littrow configuration, it is contemplated that the concepts of the present invention may be practiced in the context of a variety of conventional and yet to be developed external cavity lasers including, for example, the folded external cavity semiconductor laser 70 illustrated in FIG. 3, which comprises an external cavity formed between highly reflective dielectric coatings at the rear facet 72 of the laser diode 74 and the output facet 76 of the wavelength conversion device 78. The optically pumped, external cavity Littrow configuration of FIG. 1 is considered to be more suitable for operation above approximately 100 mW output power, while the folded external cavity semiconductor laser of FIG. 3 is considered to be more suitable for operation at or below approximately 100 mW output power. In any case, the light beam emitted by the semiconductor laser can be either directly coupled into the waveguide of the wavelength conversion device or can be coupled through collimating and focusing optics or some other type of suitable optical element or optical system.

Referring to FIG. 3, where the wavelength conversion device 78 may comprise a MgO doped PPLN crystal positioned waveguide-side down immediately above a Fabry-Perot laser diode 74, the external cavity is formed between highly reflective dielectric coatings deposited on the rear facet 72 of the laser diode 74 and the output facet 76 of the wavelength conversion device 78. For example, the dielectric coatings may be greater than 99% reflective at 1060 nm. The remaining facets of the laser diode 74 and the wavelength conversion device 78 can be AR coated, e.g., less than 1% reflective at 1060 nm. A single lens is used to couple light between the diode 74 and the crystal 78 and the wavelength selective element 60 comprises a diffraction grating. Referring additionally to FIG. 2, the grating 60 is ruled with its grooves along the Y axis, which can be convenient for polarization selection, particularly in cases where it might otherwise be necessary to provide additional optical elements for polarization rotation.

Referring to the laser source designed according to the schematic illustration of FIG. 3 as an example, the present inventors have recognized that it is possible to use a diffraction grating or other type of wavelength selective element 60 for wavelength selection and beam steering. In one embodiment, the Fabry-Perot laser diode 74 has maximum gain at 1060 nm, the diffraction grating 60 has 1200 grooves per millimeter and is blazed at 1060 nm, the nonlinear crystal 78 is 10 mm long, has a passive optical loss of 1 dB/cm and can reach up to 40% conversion efficiency to second harmonic for the maximum power that can be emitted by a laser chip, the focal length of the lens 15 is 3 mm, and the vertical separation between the laser chip and nonlinear crystal waveguides is 0.3 mm. The worst-case level of optical feedback provided to the laser diode 74 by the external cavity of the laser source can be determined using these parameters. The diffraction efficiency at the blaze wavelength for so-called multi-layer dielectric (MLD) diffraction gratings can reach 96%, and for replicated gold-coated ruled gratings—92%. Theoretical estimates based on these numbers, as well as preliminary experiments demonstrate that up to 90% coupling efficiency from the laser diode 74 to the nonlinear crystal 78 can be reached in the configuration of FIG. 3. About 20% of light is lost to scattering and absorption on a single pass through the nonlinear crystal 78, and it is estimated that the conversion efficiency to green (530 nm), which serves as a nonlinear loss for the 1060 nm light, can reach about 40%. Therefore, after one round trip in the external cavity about 25% of the light that left the laser diode 74 will return to it. This level of feedback is more than sufficient to stabilize the emission wavelength at the value determined by the maximum reflection of the diffraction grating 60. Moreover, a conversion efficiency to second harmonic will be somewhat increased by the "cavity enhancement" effect, since some of the 1060 nm photons that are not converted to second harmonic in a single pass through the nonlinear crystal 78 can be recycled and passed through the crystal again on the second round trip in the cavity. Excluding the 40% conversion loss from the calculation above, linear loss in the cavity is about 50%, which means that significant (~2×) cavity enhancement can be achieved.

Concerning the operation of the diffraction grating 60, the basic grating equation is given by:

$$\sin(\alpha)+\sin(\beta)=10^{-6}kn\lambda \quad (1)$$

where $\alpha$ is the incidence angle (from normal to the surface of the grating), $\beta$ is the diffraction angle, k is the diffraction order, n is the number of grooves per millimeter, and $\lambda$ is the wavelength in nm. The bounce angle $v$ is equal to the difference of the incidence angle $\alpha$ and diffraction angle $\beta$;

$$v=\alpha-\beta \quad (2)$$

If the distance from the lens 15 to the point of incidence on the diffraction grating 60 is 3 mm, then, for the nominal vertical separation of the laser diode 74 and the nonlinear crystal 78 of 0.3 mm, the required bounce angle is $v=\arcsin(0.3/3)=5.74$ degrees. Changing the bounce angle by ±1 degree will shift the beam vertically by more than 100 μm, which should be more than sufficient to compensate for optical misalignments caused by environmental changes.

Rewriting equation (1) as:

$$2\sin\left(\frac{\alpha+\beta}{2}\right)\cos\left(\frac{\alpha-\beta}{2}\right)=10^{-6}kn\lambda \quad (3)$$

and substituting (2) into (3), we obtain:

$$\alpha=\arcsin\left(\frac{10^{-6}kn\lambda}{2\cos\left(\frac{v}{2}\right)}\right)+\frac{v}{2} \quad (4)$$

Equation (4) shows that for any bounce angle $v$, which is defined by the relative position of the optical components of the system, and wavelength $\lambda$, which is dictated by the phase matching conditions of the crystal 78, there is a unique incidence angle $\alpha$, defining how the position of the grating 60 should be adjusted to provide both wavelength selection and optimum cavity alignment. The following table lists values of the required incidence angle $\alpha$ for 9 different combinations of the bounce angle $v$ and wavelength $\lambda$ for the example laser design described above with reference to FIG. 3, for a change in optimum phase matching wavelength for the nonlinear crystal 78 from 1058 nm to 1062 nm, which corresponds to nearly 60 degrees temperature change for a PPLN crystal with a wavelength shift due to thermal expansion of about 0.07 mm/K:

| | $\lambda$, nm | | |
|---|---|---|---|
| $v$, degrees | 1058 | 1060 | 1062 |
| 4.74 | 41.82 | 41.90 | 41.99 |
| 5.74 | 42.33 | 42.42 | 42.51 |
| 6.74 | 42.86 | 42.94 | 43.04 |

As follows from the data presented in the table, diffraction grating rotation around the Y axis by only ±0.61 degrees is sufficient to compensate both for wavelength change of ±2 nm and vertical misplacement (in the X-Z plane) of the cavity elements of ±50 μm. Horizontal misplacement (in the Y-Z plane) of ±50 μm can be compensated by rotation of the grating around the X axis by ±1 degrees. Such small rotation can be provided by electro-static MEMS, micro-motors or piezoelectric transducers attached to a micro-gimbal mount tip/tilt platform 62 holding the diffraction grating 60. This analysis is done for the case of multi-layer dielectric (MLD) gratings, which exhibit significantly better diffraction efficiency for the light polarization with the electrical field vector along the grating grooves (usually denoted as S-polarization). Since most laser diodes emit light in the TE-polarization, with the electrical filed vector in the plane of the wafer, the MLD grating has to be positioned with grooves parallel to the plane of the laser diode and nonlinear crystal wafers, and wavelength-selective reflection takes place in the plane perpendicular to both wafers (vertical direction in the above analysis). Ruled or replicated diffraction gratings exhibit better diffraction efficiency for the light polarized perpendicular to the grating grooves, and therefore have to be positioned with grooves perpendicular to the planes of the diode and crystal wafers, as shown in FIG. 2. Regardless of what type of grating is used, in the present description we always refer to the orientation of the grating grooves as the Y-axis.

It is important to consider the factors affecting spectral width and stability of the laser design of FIG. 3. For simplification, let us assume that the lasing starts first in the external cavity mode with the wavelength closest to maximum reflection of the grating. If that wavelength is phase matched, strong nonlinear loss will be introduced by conversion to second harmonic, and other adjacent external cavity modes will receive larger feedback from the external cavity and start lasing, broadening the spectrum. Competition between external cavity modes caused by a nonlinear loss due to second harmonic and sum frequency generation can cause strong noise to be present in the laser output.

The spectral width of a wavelength selective element formed by a diffraction grating, and therefore expected spectral width of the laser output in the example above, can be estimated as follows. For a diffraction angle of 36.68 degrees, the angular dispersion of the 1200 g/mm grating is.

$$\frac{d\beta}{d\lambda} = \frac{1200 \cdot 10^6}{\cos\beta} = 1.5 \times 10^{-3} \text{ rad/nm} \quad (5)$$

Therefore, a wavelength change of $\Delta\lambda$ will produce a change is diffraction angle $\Delta\beta = 1.5 \times 10^{-3} \Delta\lambda$. The shift in a focal spot position $\Delta y$ is approximately equal to $\Delta y = \Delta\beta \cdot f$, where f=3 mm is the focal length of the lens. Thus, $\Delta y$ is related to $\Delta\lambda$ by $\Delta y = f \cdot 1.5 \times 10^{-3} \cdot \Delta\lambda$. Assuming that 1 μm displacement of the focal spot causes 2× decrease in the coupling efficiency, the full width at half maximum (FWHM) of the grating is $2 \cdot 1$ μm/3000 μm/$1.5 \times 10^{-3}$=0.44 mm. Since the filter is applied twice, once for coupling from a laser diode 74 to the nonlinear crystal 78 and once for coupling back, we can expect that for the round trip in the cavity the effective filter FWHM is about a factor of square root of 2 less than that, or 0.31 nm.

The mode spacing for the external cavity is c/2 L, where c is the speed of light and L is the effective length of the cavity, equal to the sum of physical lengths of all of the cavity segments multiplied by their respective refractive index. Assuming a laser diode length of 2 mm and refractive index of 3.5, and nonlinear crystal length of 10 mm and refractive index of 2.2, L=2·3.5+12+10·2.2=41 mm and the mode spacing is 3.66 GHz or 0.0137 nm. If the spectral width of the laser output reaches 0.31 nm, this means that there are about 22 modes present, a large enough number so that the noise in the form of power fluctuations caused by mode competition can be expected to be small.

The wider spectrum 1060 nm light will be converted into wider spectrum second harmonic output at 530 m-about 0.15 nm for the example above. Although this can be beneficial for some applications, for example projection display where wider spectrum will result in some degree of suppression of the speckle related noise, 0.31 nm is wider than the spectral acceptance of the 10 mm long PPLN which is <0.1 nm. There are two ways to circumvent this problem. One is to use a reflective optical element with stronger wavelength selectivity, for example a diffraction grating with larger angular dispersion (higher groove density). Up to 1800 g/mm is possible for gratings blazed at 1060 nm. The other is to use a physically shorter PPLN crystal. However, shortening the crystal will typically result in decreased conversion efficiency. To avoid this efficiency decrease, the "effective" length of the crystal 78 can be increased by depositing a dichroic coating on the input face 75 of the crystal 78, the dichroic coating being highly reflective at 530 nm, which is the wavelength of the frequency converted output of the crystal 78, and highly transmissive at 1060 nm, which is the native lasing wavelength of the laser diode 74. In this case, the frequency converted optical signal will be generated in a dual pass through the crystal, originating at the output end and traversing the crystal length the second time after being reflected at its input end. Typically, this configuration requires the optical phase of the reflection at the input end (the position of the crystal end face in respect to the periodic poling) to be precisely controlled to ensure that the reflected second harmonic light is in the right phase with respect to the 1060 nm light entering the crystal 78. However, for the specific example described here it might not be necessary because the coherence length for the 0.31 nm wide spectrum is 3.6 mm in air and 1.6 mm inside the lithium niobate, significantly less than the length of the crystal even if it is shortened to 5 mm.

Another way to increase the conversion efficiency is to operate the laser in a pulsed mode, such that the peak power is higher than the average power. For example, a sinusoidal modulation can be applied to the laser diode drive current with a frequency equal to the fundamental external cavity frequency or one of its sub-harmonics. If the modulation amplitude is high enough, the laser will operate in what is known as a gain-switching mode, with a short optical pulse being emitted for every positive half-period of the sinusoidal modulation. If the modulation is synchronized to the fundamental external cavity frequency or one of its sub-harmonies, the reflection from a far end of the nonlinear crystal will arrive just in time to stabilize the wavelength of the next optical pulse emitted. Even for a relatively small amplitude modulation on top of the above-threshold DC bias, it can be expected that partial or full synchronization of the external cavity mode phases will take place—a condition referred to as mode locking.

Mode-locking produced by drive current modulation is known as active mode-locking. A Fabry-Perot laser diode with a two-section electrical contact, where the continuous active waveguide is divided into "gain" and "absorber" sections, can operate in a pulsed mode without external modulation if a DC bias is applied to the gain section and the absorber section is shorted or reverse biased. Such modes are known as passive Q-switching or passive mode-locking, depending on the specifics of the diode operation, and can be used in the embodiments of the present invention to increase wavelength conversion efficiency.

For the purposes of describing and defining the present invention, it is noted that the references herein to the "tilting" and "tipping" of the wavelength selective element should not be interpreted to denote any fundamental differences between the types of mechanisms used for the described actuation. Rather, the references to "tilting" and "tipping" are merely introduced herein to distinguish between rotation about the two different axes, Y and X.

It is to be understood that the preceding detailed description of the invention is intended to provide an overview or framework for understanding the nature and character of the invention as it is claimed. It will be apparent to those skilled in the art that various modifications and variations can be made to the present invention without departing from the spirit and scope of the invention. Thus, it is intended that the present invention covers the modifications and variations of this invention provided they come within the scope of the appended claims and their equivalents.

It should be further understood that references herein to particular steps or operations that are described or claimed herein as being performed "as a function" of a particular state, condition, value, or other type of variable or parameter should not be read to limit execution of the step or operation solely as a function of the named variable or parameter. Rather, it should be understood that additional factors may play a role in the performance of the step or operation.

It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the terms "approximately" or "about" are utilized herein to represent the inherent degree of uncertainty that may be attributed to any quantitative comparison, value, measurement, or other representation. The terms are also utilized herein to represent the degree by which a quantitative representation. e.g., "substantially above zero," varies from a stated reference, e.g., "zero," and should be interpreted to require that the quantitative representation varies from the stated reference by a readily discernable amount.

It is also noted that recitations herein of a component of the present invention being "configured" or "programmed" in a particular way, to embody a particular property, or function in a particular manner, are structural recitations as opposed to recitations of intended use. More specifically, the references herein to the manner in which a component is "configured" or "programmed" denote an existing physical condition of the component and, as such, are to be taken as a definite recitation of the structural characteristics of the component.

What is claimed is:

1. A method of operating a laser projection system comprising an external cavity laser, an optical intensity monitor, laser projection optics, and a controller, wherein the external cavity laser comprises a laser diode, an intra-cavity wavelength conversion device, and a wavelength selective element for wavelength selection and beam steering through the wavelength conversion device and the method comprises:
   monitoring an output intensity of the external cavity laser; and
   adjusting the position of the wavelength selective element relative to an optical axis Z of the external cavity laser to optimize the output intensity, wherein the position of the wavelength selective element is adjusted by
      tilting the wavelength selective element about its wavelength selective axis Y to reflect a wavelength of interest along an optimum path in an XZ plane of the external laser cavity and
      operating the wavelength selective element as an adaptive mirror to maintain optimal coupling of light within the wavelength conversion device by tipping the wavelength selective element about its wavelength insensitive axis X to reflect the wavelength of interest back along a beam axis along an optimum path through the wavelength conversion device in a YZ plane of the external laser cavity, wherein the wavelength selective element is configured such that a given degree of tipping about the wavelength insensitive axis X changes the path of the back-reflected wavelength of interest, relative to the wavelength conversion device, to maintain optical coupling of light with the wavelength conversion device.

2. A method as claimed in claim 1 wherein the wavelength selective element is tilted about the wavelength selective axis Y such that the reflected wavelength of interest matches an optimum phase matching wavelength of the intra-cavity wavelength conversion device.

3. A method as claimed in claim 1 wherein the wavelength selective element is configured such that a given degree of tipping about the wavelength insensitive axis X yields an insignificant degree of wavelength tuning relative to that which would be generated under a corresponding degree of tilting about the wavelength selective axis Y.

4. A method as claimed in claim 1 wherein the wavelength selective element is tipped such that the path of the reflected wavelength of interest is directed back through the intra-cavity wavelength conversion device with sub-micron precision.

5. A method as claimed in claim 1 wherein the method alternates between tilting and tipping of the wavelength selective element in an iterative process until the wavelength of interest is reflected along the optimum path in the XZ and YZ planes.

6. A method as claimed in claim 1 wherein the method executes the tilting and tipping of the wavelength selective element simultaneously until the wavelength of interest is reflected along the optimum path in the XZ and YZ planes.

7. A method as claimed in claim 1 wherein:
   the wavelength selective element is tilted about the wavelength selective axis Y until the wavelength of interest is reflected along the optimum path in the XZ plane of the external laser cavity; and
   the wavelength selective element is subsequently tipped about the wavelength insensitive axis X until the wavelength of interest is reflected along the optimum path in the YZ plane of the external laser cavity.

8. A method as claimed in claim 1 wherein the method executes the tilting and tipping of the wavelength selective element such that the wavelength selective element serves both as a wavelength tuning element and as an adaptive mirror to maintain optimal coupling of light within the external cavity laser.

9. A method as claimed in claim 1 wherein the method executes the tilting and tipping of the wavelength selective element while monitoring a wavelength-converted output intensity of the external cavity laser or a native wavelength output intensity of the external cavity laser.

10. A method as claimed in claim 1 wherein the method further comprises operating the laser projection optics to generate a scanned laser image using an output beam of the external cavity laser and the tilting and tipping of the wavelength selective element is executed while generating the scanned laser image.

11. A method as claimed in claim 1 wherein the external cavity laser is driven by a sinusoidally varying or pulsed current such that the laser operates in a pulsed mode to increase the wavelength conversion efficiency.

12. A method as claimed in claim 1 wherein the external cavity laser comprises a Fabry-Perot laser diode comprising a continuous active waveguide divided into gain and absorber sections, and the method comprises operating the laser in a Q-switched or mode-locked pulsed mode without external modulation by applying a DC bias to the gain section of the laser diode and by shorting or reverse biasing the absorber section of the laser diode.

13. A method as claimed in claim 1 wherein the wavelength selective element comprises a ruled, multi-layer dielectric or holographic diffraction grating, a prism with a highly reflective coating on one of its sides, or a combination of a prism and a grating.

14. A method as claimed in claim 1 wherein the wavelength selective element is coupled to a multi-axial actuator to enable tilting and tipping about the X and Y axes.

15. A method as claimed in claim 1 wherein the laser diode, the intra-cavity wavelength conversion device, and the wavelength selective element are assembled as an optically pumped, external cavity Littrow configuration.

16. A method as claimed in claim 1 wherein the laser diode, the intra-cavity wavelength conversion device, and the wavelength selective element are assembled as a folded external cavity semiconductor laser comprising an external cavity formed between highly reflective dielectric coatings at the rear facet of the laser diode and the output face of the wavelength conversion device.

17. A method as claimed in claim 16 wherein a dichroic coating is deposited on the input face of the wavelength conversion device to increase the effective optical path length of the wavelength conversion device, the dichroic coating being highly transmissive at the native lasing wavelength of the laser diode and highly reflective at the frequency converted output of the wavelength conversion device.

18. An external cavity laser comprising a laser diode, an intra-cavity wavelength conversion device, a wavelength selective element for wavelength selection and beam steering through the wavelength conversion device, and a multi-axial actuator, wherein:

- the laser diode, the intra-cavity wavelength conversion device, and the wavelength selective element are assembled as a folded external cavity semiconductor laser comprising an external cavity formed between highly reflective dielectric coatings at the rear facet of the laser diode and the output face of the wavelength conversion device;
- the wavelength selective element is coupled to the multi-axial actuator to enable operation of the wavelength selective element as an adaptive mirror to maintain optimal coupling of light within the wavelength conversion device through adjustment of the position of the wavelength selective element relative to an optical axis Z of the external cavity laser by tilting and tipping the wavelength selective element about a wavelength insensitive axis X and a wavelength selective axis Y;
- the tilting of the wavelength selective element about its wavelength selective axis Y reflects a wavelength of interest along an optimum path in an XZ plane of the external laser cavity;
- the tipping of the wavelength selective element about its wavelength insensitive axis X reflects the wavelength of interest back along a beam axis along an optimum path through the wavelength conversion device in a YZ plane of the external laser cavity; and
- the wavelength selective element is configured such that a given degree of tipping about the wavelength insensitive axis X changes the path of the back-reflected wavelength of interest, relative to the wavelength conversion device, to maintain optical coupling of light with the wavelength conversion device.

19. A system for generating a projected laser image, the system comprising an external cavity laser, an optical intensity monitor, laser projection optics, and a controller, wherein:

- the controller, the external cavity laser, and the laser projection optics are configured to generate a projected laser image utilizing an output beam of the external cavity laser;
- the external cavity laser comprises a laser diode, an intra-cavity wavelength conversion device, and a wavelength selective element for wavelength selection and beam steering through the wavelength conversion device;
- the external cavity laser, the optical intensity monitor, and the controller form at least a portion of a feedback loop configured to control the wavelength selective element as a function of optical intensity;
- the system is programmed to operate the wavelength selective element as an adaptive minor to maintain optimal coupling of light within the wavelength conversion device by adjusting the position of the wavelength selective element relative to an optical axis Z of the external cavity laser to optimize the output intensity by tilting the wavelength selective element about its wavelength selective axis Y to reflect a wavelength of interest along an optimum path in an XZ plane of the external laser cavity and tipping the wavelength selective element about its wavelength insensitive axis X to reflect the wavelength of interest back along a beam axis along an optimum path through the wavelength conversion device in a YZ plane of the external laser cavity; and
- the wavelength selective element is configured such that a given degree of tipping about the wavelength insensitive axis X changes the path of the back-reflected wavelength of interest, relative to the wavelength conversion device, to maintain optical coupling of light with the wavelength conversion device.

* * * * *